United States Patent
Okabe et al.

(10) Patent No.: US 9,896,745 B2
(45) Date of Patent: *Feb. 20, 2018

(54) COPPER ALLOY SPUTTERING TARGET AND METHOD FOR MANUFACTURING THE TARGET

(75) Inventors: Takeo Okabe, Ibaraki (JP); Hirohito Miyashita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 2509 days.

This patent is subject to a terminal disclaimer.

(21) Appl. No.: 10/501,117

(22) PCT Filed: Dec. 4, 2002

(86) PCT No.: PCT/JP02/12697
§ 371 (c)(1),
(2), (4) Date: Jan. 14, 2005

(87) PCT Pub. No.: WO03/064722
PCT Pub. Date: Aug. 7, 2003

(65) Prior Publication Data
US 2005/0121320 A1 Jun. 9, 2005

(30) Foreign Application Priority Data
Jan. 30, 2002 (JP) .................................. 2002-020928

(51) Int. Cl.
*C22C 9/00* (2006.01)
*C22C 9/01* (2006.01)
*C22C 9/02* (2006.01)
*C23C 14/34* (2006.01)
*H01L 23/532* (2006.01)

(52) U.S. Cl.
CPC ............... *C22C 9/02* (2013.01); *C22C 9/00* (2013.01); *C22C 9/01* (2013.01); *C23C 14/3414* (2013.01); *H01L 23/53233* (2013.01); *H01L 2924/0002* (2013.01)

(58) Field of Classification Search
CPC .... C22C 9/00; C22C 9/01; C22C 9/02; C23C 14/3414; H01L 21/76838
USPC ............. 148/432–436; 420/489; 204/192.15, 204/298.06
See application file for complete search history.

(56) References Cited

U.S. PATENT DOCUMENTS

| | | |
|---|---|---|
| 4,822,560 A | 4/1989 | Oyama et al. |
| 5,023,698 A | 6/1991 | Kobayashi et al. |
| 6,113,761 A | 9/2000 | Kardokus et al. |
| 6,143,427 A | 11/2000 | Andler |
| 6,228,759 B1 | 5/2001 | Wang et al. |
| 6,238,494 B1 * | 5/2001 | Segal .................. B21B 1/38 148/421 |
| 6,391,163 B1 * | 5/2002 | Pavate et al. ............ 204/192.15 |
| 6,451,135 B1 * | 9/2002 | Takahashi et al. ........... 148/432 |
| 6,569,270 B2 | 5/2003 | Segal |
| 7,507,304 B2 | 3/2009 | Okabe et al. |
| 7,740,721 B2 * | 6/2010 | Okabe .................. C23C 14/3414 148/426 |
| 2002/0024142 A1 | 2/2002 | Sekiguchi ...................... 257/758 |
| 2004/0004288 A1 | 1/2004 | Sekiguchi ...................... 257/758 |
| 2006/0088436 A1 | 4/2006 | Okabe |
| 2007/0051624 A1 | 3/2007 | Okabe et al. |
| 2007/0209547 A1 | 9/2007 | Irumata et al. |
| 2010/0219070 A1 * | 9/2010 | Okabe .................. C23C 14/3414 204/298.13 |

FOREIGN PATENT DOCUMENTS

| | | |
|---|---|---|
| EP | 0206906 A2 | 3/1988 |
| EP | 0601509 A * | 6/1994 |
| EP | 0601509 A1 | 6/1994 |
| EP | 1026284 A1 | 8/2000 |
| JP | 49-23127 | 3/1974 |
| JP | 61-231131 A | 10/1986 |
| JP | 63-065039 A | 3/1988 |
| JP | H03-072043 A | 3/1991 |
| JP | H05-311424 A | 11/1993 |
| JP | 06-177128 * | 6/1994 |
| JP | H10-060633 A | 3/1998 |
| JP | 10-330927 | 12/1998 |
| JP | 2000-087158 A | 3/2000 |
| JP | 2000-239836 | 9/2000 |

(Continued)

OTHER PUBLICATIONS

Patent Abstracts of Japan, 1 page English Abstract of JP 2002-075995, Mar. 2002.

(Continued)

*Primary Examiner* — Keith Walker
*Assistant Examiner* — John A Hevey
(74) *Attorney, Agent, or Firm* — Howson & Howson LLP

(57) ABSTRACT

A copper alloy sputtering target most suitable for formation of an interconnection material of a semiconductor device, particularly for formation of a seed layer, characterized in that the target contains 0.4 to 5 wt % of Sn, and the structure of the target does not substantially contain any precipitates, and the resistivity of the target material is 2.2 μΩcm or more. This target enables formation of an interconnection material of a semiconductor device, particularly a uniform seed layer stable during copper electroplating and is excellent in sputtering deposition characteristics. A method for manufacturing such a target is also disclosed.

14 Claims, No Drawings

(56) References Cited

FOREIGN PATENT DOCUMENTS

JP           2001-284358 A     10/2001
JP           2002-075995        3/2002

OTHER PUBLICATIONS

Patent Abstracts of Japan, 1 page English Abstract of JP 2000-239836, Sep. 2000.
Patent Abstracts of Japan, 1 page English Abstract of JP 10-330927, Dec. 1998.
Derwent, 1 page English Abstract of JP 49-23127, Mar. 1974.

\* cited by examiner

COPPER ALLOY SPUTTERING TARGET AND METHOD FOR MANUFACTURING THE TARGET

BACKGROUND OF THE INVENTION

The present invention pertains to a copper alloy sputtering target capable of forming an interconnection material of a semiconductor device, particularly a stable and even seed layer during electroplating, and superior in sputtering deposition characteristics. The present invention also pertains to the manufacturing method of such a target.

Conventionally, although Al (resistivity of roughly 3.1 µΩ·cm) has been used as the interconnection material of a semiconductor device, low-resistivity copper interconnection (resistivity of roughly 1.7 µΩ·cm) has been put into practical application pursuant to the miniaturization of wiring.

As the current formation process of copper interconnection, after forming a diffusion barrier layer such as Ta/TaN to the concave portion of a contact hole or wiring groove, copper electroplating is often performed thereto. As the base layer (seed layer) for performing this electroplating, sputtering deposition is generally performed to copper or copper alloy.

The even formation of this base layer is important, and, if the base layer agglomerares, an even film cannot be formed upon forming a copper film with electroplating. For instance, defects such as voids, hillocks, disconnections and so on may be formed during the wiring.

Further, even if defects such as a void are not formed, an uneven copper electrodeposit will be formed at this portion, and a problem will arise in that the electromigration resistance characteristics will deteriorate.

In order to overcome this problem, it is important to form a stable and even seed layer during copper electroplating, and a sputtering target having superior sputtering deposition characteristics and being optimum for forming a seed layer will be required therefor.

Heretofore, as the copper interconnection material, a proposal has been made of adding certain elements to copper so as to improve the electromigration (EM) resistance characteristics, corrosion resistance, bond strength, and so on. For example, Japanese Patent Laid-Open Publication No. H5-311424 and Japanese Patent Laid-Open Publication No. H10-60633 disclose a pure copper target or a target to which 0.04 to 0.15 wt % of Ti is added to the pure copper.

And, in these proposals, it is proposed that rapid cooling be performed for the even dispersion of the added elements, or continuous casting be performed for preventing the segregation of the added elements in an ingot, ingot piping during casting, or enlargement of the crystal grains of the ingot.

Nevertheless, even if high purity copper is used alone or with minute amounts of metal added thereto, although there is an advantage in that the resistivity will be low, problems regarding electromigration and oxidation resistance during the process still remain, and these materials are not necessarily favorable materials.

In particular, since the aspect ratio is becoming higher (aspect ratio of 4 or higher) in recent days, sufficient electromigration resistance and oxidation resistance are required.

In light of the above, although a copper alloy sputtering target formed from high purity copper or with certain elements added thereto has been proposed, conventionally, this was not exactly sufficient.

Accordingly, an object of the present invention is to provide a copper alloy sputtering target capable of forming an interconnection material of a semiconductor device, particularly a stable and even seed layer during electroplating, and superior in sputtering deposition characteristics. Another object of the present invention is to provide a manufacturing method of such a target.

SUMMARY OF THE INVENTION

In order to achieve the foregoing objects, as a result of conducting intense study, the present inventors have discovered that, as a result of adding a suitable amount of metal elements, it is possible to obtain a copper alloy sputtering target capable of preventing the generation of defects such as voids, hillocks and disconnections during copper electroplating, which has low resistivity, which has electromigration resistance and oxidization resistance characteristics, and which is able to form a stable and even seed layer.

Based on the foregoing discovery, the present invention provides:

1. A copper alloy sputtering target most suitable for formation of an interconnection material of a semiconductor device, particularly for formation of a seed layer, wherein said target contains 0.4 to 5 wt % of Sn, the structure of the target does not substantially contain any precipitates, and the resistivity of the target material is 2.3 µΩcm or more;
2. A copper alloy sputtering target according to paragraph 1 above, wherein said target contains 0.5 to 1 wt % of Sn;
3. A copper alloy sputtering target most suitable for formation of an interconnection material of a semiconductor device, particularly for formation of a seed layer, wherein said target contains 0.2 to 5 wt % of Al, the structure of the target does not substantially contain any precipitates, and the resistivity of the target material is 2.2 µΩcm or more;
4. A copper alloy sputtering target according to paragraph 3 above, wherein said target contains 0.5 to 1 wt % of Al;
5. A copper alloy sputtering target most suitable for formation of an interconnection material of a semiconductor device, particularly for formation of a seed layer, wherein said target contains 0.3 to 5 wt % of Ti, the structure of the target does not substantially contain any precipitates, and the resistivity of the target material is 9 µΩcm or more;
6. A copper alloy sputtering target according to paragraph 5 above, wherein said target contains 0.5 to 1 wt % of Ti;
7. A copper alloy sputtering target most suitable for formation of an interconnection material of a semiconductor device, particularly for formation of a seed layer, wherein said target contains a total of 0.2 to 5 wt % of at least one component selected from Sn, Al and Ti, the structure of the target does not substantially contain any precipitates, and the resistivity of the target material is greater than the resistivity of the copper alloy having the same composition in a thermal equilibrium state;
8. A copper alloy sputtering target according to paragraph 7 above, wherein said target contains a total of 0.5 to 1 wt % of at least one component selected from Sn, Al and Ti;
9. A copper alloy sputtering target according to paragraph 7 or paragraph 8, wherein the increase in resistivity due to the alloying element is resistivity that is 1.2 times or more than that of the thermal equilibrium;
10. A copper alloy sputtering target according to any one of paragraphs 1 to 9 above, wherein Na and K are respectively 0.5 ppm or less; Fe, Ni, Cr and Ca are respectively 2 ppm or less; U and Th are respectively 1 ppb or less, oxygen is 5 ppm or less, hydrogen is 2 ppm or less; and unavoidable impurities excluding alloying additional elements are 50 ppm or less;

11. A copper alloy sputtering target according to any one of paragraphs 1 to 9 above, wherein Na and K are respectively 0.1 ppm or less; Fe, Ni, Cr and Ca are respectively 1 ppm or less; U and Th are respectively 1 ppb or less, oxygen is 5 ppm or less, hydrogen is 2 ppm or less; and unavoidable impurities excluding alloying additional elements are 10 ppm or less;

12. A copper alloy sputtering target according to any one of paragraphs 1 to 11 above, wherein the crystal grain size of the target material is 50 µm or less, and the variation in the average grain size by location is within ±20%;

13. A copper alloy sputtering target according to any one of paragraphs 1 to 12 above, wherein the variation in the alloying element of the target material within 0.2%;

14. A copper alloy sputtering target according to any one of paragraphs 1 to 13 above, wherein, when the alloy contains Al, the ratio I(111)/I(200) of the X-ray diffraction peak intensity I(111) of the (111) face and the X-ray diffraction peak intensity I(200) of the (200) face is 2.2 or more in the sputtering face, and, when the alloy contains Sn and/or Ti, the ratio I(111)/I(200) of the X-ray diffraction peak intensity I(111) of the (111) face and the X-ray diffraction peak intensity I(200) of the (200) face is 2.2 or less in the sputtering face, and the variation in I(111)/I(200) in the sputtering face is respectively within ±30%; and 15. A manufacturing method of a copper alloy sputtering target according to any one of paragraphs 1 to 14 above, comprising the steps of performing hot forging and/or hot rolling to a high purity copper alloy ingot obtained by vacuum melting; further performing cold rolling thereto; and thereafter sandwiching this with copper plates underwater and performing forced cooling thereto during heat treatment.

DETAILED DESCRIPTION OF THE INVENTION

The copper alloy sputtering target of the present invention contains a 0.4 to 5 wt %, preferably 0.5 to 1 wt % of Sn; 0.2 to 5 wt %, preferably 0.5 to 1 wt % of Al; 0.3 to 5 wt %, preferably 0.5 to 1 wt % of Ti; respectively, or a total of 0.2 to 5 wt % of at least one component selected from Sn, Al and Ti.

When 0.4 to 5 wt % of Sn is independently added, resistivity of the target material will be 2.3 µΩcm or more; when 0.2 to 5 wt % of Al is independently added, resistivity of the target material will be 2.2 µΩcm or more, and when 0.3 to 5 wt % of Ti is independently added, resistivity of the target material will be 9 µΩcm or more. Further, when these are mixed and added, resistivity of the target material will be 2.2 µΩcm or more. These may be suitably selected and used for the formation of a seed layer during copper electroplating.

Although the structure of the copper alloy sputtering target of the present invention does not substantially contain any precipitates, when the foregoing additive amount of alloy exceeds 5 wt %, precipitates will arise during the manufacture process of the target.

When precipitates exist in the target structure, particles will be generated since the sputtering rate between the matrix phase and precipitate phase will differ, and problems such as wiring disconnections in the semiconductor device will occur.

In particular, it has become evident that these precipitates are formed in the center (middle) of the target separate from the surface, and not near the target surface.

Therefore, problems caused by precipitates occur not during the initial phase of sputtering, but from a stage in which the erosion of the target caused by sputtering has progressed to a certain degree. In other words, precipitates are caused by minute particles getting mixed into the sputtering film, or due to the micro unevenness of the film composition midway during sputtering.

As a matter of course, since such uneven portions of the seed film generate uneven electric fields, the copper plating film structure will become uneven and minute, and electromigration resistance characteristics will deteriorate, which is obviously unfavorable. Although the problem is often overlooked since it does not occur in the initial stages, this is a major problem.

In light of the above, in order to confirm the existence of precipitates in the target, it is insufficient to search only the mechanical strength characteristics such as the resistivity value and hardness of the target surface with the likes of XRD, and it is necessary to also search the inside of the target with high resolution SEM.

Further, with the copper alloy sputtering target of the present invention, it is desirable that Na and K are respectively 0.5 ppm or less, preferably 0.1 ppm or less; Fe, Ni, Cr and Ca are respectively 2 ppm or less, preferably 1 ppm or less; U and Th are respectively 1 ppb or less, oxygen is 5 ppm or less, hydrogen is 2 ppm or less; and unavoidable impurities excluding alloying additional elements are 50 ppm or less. These elements are harmful components that may diffuse and contaminate the semiconductor device.

It is preferable that the crystal grain size of the target material is 50 µm or less, and the variation in the average grain size by location is within ±20%. The crystal grain size of the target and variations in the average grain size by location will affect the uniformity of the film thickness.

Moreover, when the variation is significant in the alloy elements of the target material, the characteristic values of the target material will change and therefore cause the interconnection material of the semiconductor device, particularly the resistivity of the seed layer, to change, and it is desirable that the variation be within 0.2%.

Further, orientation of the crystal will also affect the uniformity of the film thickness. Generally, although it is considered that a random orientation is favorable, depending on the type of additive element, a specific crystal orientation with the variation being within a certain range will yield a further superior uniformity of the film thickness.

In other words, when the alloy contains Al, the ratio I(111)/I(200) of the X-ray diffraction peak intensity I(111) of the (111) face and the X-ray diffraction peak intensity I (200) of the (200) face is 2.2 or more in the sputtering face, and, when the alloy contains Sn and/or Ti, the ratio I(111)/I(200) of the X-ray diffraction peak intensity I(111) of the (111) face and the X-ray diffraction peak intensity I(200) of the (200) face is 2.2 or less in the sputtering face. And, when the variation in I(111)/I(200) in the sputtering face is respectively within ±30%, the film thickness standard deviation σ will be 1.5% or less, and a copper alloy sputtering target superior in uniformity of the film thickness can be obtained thereby.

Further, upon manufacturing the target, after performing homogenization heat treatment with a certain degree of thickness, in the subsequent cooling step, it is important to sandwich this with metals having a large thermal capacity such as copper plates underwater, and to increase the cooling effect without generating a vapor layer on the surface thereof. This is because if a vapor layer is formed, the cooling effect will significantly deteriorate.

EXAMPLES AND COMPARATIVE EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1-1

Electrolytic copper (purity of 99.95%) was subject to electrolytic refining in nitric solution so as to differentiate anodes from cathodes with a diaphragm such that it became a purity of 99.9999%. 1.0 wt % of Sn (purity of 99.9999%) was added thereto, and this was subject to vacuum melting in order to prepare a high purity copper alloy ingot (φ 160×60t) containing 1.0 wt % of Sn.

This ingot was heated to 400° C. and subject to hot forging such that it became φ 190×40t. Further, this was heated to 400° C. and rolled until it became φ 265×20t. Thereafter, this was rolled until it became φ 360×10t with cold rolling, heat treatment was performed thereto at 500° C. for 1 hour, and this was sandwiched with copper plates under water for forced cooling.

Moreover, this was machine processed to obtain a discoid target having a diameter of 13 inches and a thickness of 7 mm.

Example 1-2

Electrolytic copper (purity of 99.95%) was subject to electrolytic refining in nitric solution so as to differentiate anodes from cathodes with a diaphragm such that it became a purity of 99.9999%. 0.5 wt % of Sn (purity of 99.9999%) was added thereto, and this was subject to vacuum melting in order to prepare a high purity copper alloy ingot (φ 160×60t) containing 0.5 wt % of Sn.

With the other conditions being the same as Example 1-1, a copper alloy target containing 0.5 wt % of Sn was prepared.

Comparative Example 1-1

Using the same materials as Example 1-1, after performing heat treatment at 500 degrees for 1 hour, this was cooled in a furnace. The other conditions were the same as Example 1-1. As a result, a copper alloy target containing 1.0 wt % of Sn was prepared.

Comparative Example 1-2

Using the same materials as Example 1-2, after performing heat treatment at 500 degrees for 1 hour, this was cooled in a furnace. The other conditions were the same as Example 1-2. As a result, a copper alloy target containing 0.5 wt % of Sn was prepared.

Example 2-1

Electrolytic copper (purity of 99.95%) was subject to electrolytic refining in nitric solution so as to differentiate anodes from cathodes with a diaphragm such that it became a purity of 99.9999%. 1.0 wt % of Al (purity of 99.9999%) was added thereto, and this was subject to vacuum melting in order to prepare a high purity copper alloy ingot (φ 160×60t) containing 1.0 wt % of Al.

This ingot was heated to 400° C. and subject to hot forging such that it became φ 190×40t. Further, this was heated to 400° C. and rolled until it became φ 265×20t. Thereafter, this was rolled until it became φ 360×10t with cold rolling, heat treatment was performed thereto at 500° C. for 1 hour, and this was sandwiched with copper plates under water for forced cooling. Moreover, this was machine processed to obtain a discoid target having a diameter of 13 inches and a thickness of 7 mm.

Example 2-2

Electrolytic copper (purity of 99.95%) was subject to electrolytic refining in nitric solution so as to differentiate anodes from cathodes with a diaphragm such that it became a purity of 99.9999%. 0.5 wt % of Al (purity of 99.9999%) was added thereto, and this was subject to vacuum melting in order to prepare a high purity copper alloy ingot (φ 160×60t) containing 0.5 wt % of Al.

With the other conditions being the same as Example 2-1, a copper alloy target containing 0.5 wt % of Al was prepared.

Comparative Example 2-1

Using the same materials as Example 2-1, after performing heat treatment at 500 degrees for 1 hour, this was cooled in a furnace. The other conditions were the same as Example 2-1. As a result, a copper alloy target containing 1.0 wt % of Al was prepared.

Comparative Example 2-2

Using the same materials as Example 2-2, after performing heat treatment at 500 degrees for 1 hour, this was cooled in a furnace. The other conditions were the same as Example 2-2. As a result, a copper alloy target containing 0.5 wt % of Al was prepared.

Example 3-1

Electrolytic copper (purity of 99.95%) was subject to electrolytic refining in nitric solution so as to differentiate anodes from cathodes with a diaphragm such that it became a purity of 99.9999%. 1.0 wt % of Ti (purity of 99.9999%) was added thereto, and this was subject to vacuum melting in order to prepare a high purity copper alloy ingot (φ 160×60t) containing 1.0 wt % of Ti.

This ingot was heated to 400° C. and subject to hot forging such that it became φ 190×40t. Further, this was heated to 400° C. and rolled until it became φ 265×20t. Thereafter, this was rolled until it became φ 360×10t with cold rolling, heat treatment was performed thereto at 500° C. for 1 hour, and this was sandwiched with copper plates under water for forced cooling.

Moreover, this was machine processed to obtain a discoid target having a diameter of 13 inches and a thickness of 7 mm.

Example 3-2

Electrolytic copper (purity of 99.95%) was subject to electrolytic refining in nitric solution so as to differentiate anodes from cathodes with a diaphragm such that it became a purity of 99.9999%. 0.5 wt % of Ti (purity of 99.9999%) was added thereto, and this was subject to vacuum melting in order to prepare a high purity copper alloy ingot (φ 160×60t) containing 0.5 wt % of Ti.

With the other conditions being the same as Example 3-1, a copper alloy target containing 0.5 wt % of Ti was prepared.

Comparative Example 3-1

Using the same materials as Example 3-1, after performing heat treatment at 500 degrees for 1 hour, this was cooled in a furnace. The other conditions were the same as Example 3-1. As a result, a copper alloy target containing 1.0 wt % of Ti was prepared.

Comparative Example 3-2

Using the same materials as Example 3-2, after performing heat treatment at 500 degrees for 1 hour, this was cooled in a furnace. The other conditions were the same as Example 3-2. As a result, a copper alloy target containing 0.5 wt % of Ti was prepared.

Evaluation Results of Examples 1-1 to 3-2 and Comparative Examples 1-1 to 3-2

With respect to the targets prepared in foregoing Examples 1-1 to 3-2 and Comparative Examples 1-1 to 3-2, measurement, observation, research and so on regarding the resistivity (μΩ·cm), precipitates, crystal grain size, variation, existence of voids, hillocks and disconnections were conducted. The results are shown in Table 1. Further, the analysis results of impurities of the targets are shown in Table 2.

Further, the crystal grain size was calculated with the method of section prescribed in JIS H0501, and the variation was calculated by radially measuring 17 points (center, and 8 points of 1/2R and 8 points of R) of the sputtering face of the target. Moreover, the existence of precipitates was searched with high resolution SEM.

The resistivity was calculated by measuring 17 points, respectively, in the upper face, lower face and middle face of the target with the four-terminal method. Regarding the EM characteristics evaluation, after depositing a Ta/TaN diffusion barrier to a wiring groove having a wiring width of 0.2 μm and depth of 0.8 μm, a copper alloy seed film of 500 Å (deposition film thickness on a flat substrate) was formed on each of the various targets described above. Thereafter, with copper containing phosphorus as the anode, a copper film was embedded with the electroplating method, and excess film at the upper part was removed with the CMP method. Thereafter, annealing was performed at 400° C. in an Ar gas atmosphere, current having a current density of $10^{12}$/ampere was applied to the wiring net for 1 hour in order to observe the existence of voids and hillocks in the wiring as electromigration (EM) characteristics.

Further, the ratio I(111)/I(200) of the X-ray diffraction peak intensity I(111) of the (111) face and the X-ray diffraction peak intensity I(200) of the (200) face which corresponds to Example 1-1 and Example 1-2 is shown in Table 3, the ratio of I(111)/I(200) corresponding to Example 2-1 and Example 2-2 is shown in Table 4, and the ratio of I(111)/I(200) corresponding to Examples 3-1 and Example 3-2 is shown in Table 5, respectively.

Moreover, the influence (film thickness standard deviation σ(%)) of the ratio I(111)/I(200) with the X-ray diffraction peak intensity I(200) on the film thickness distribution is shown in Table 6. Here, the variation of I(111)/I(200) in the sputtering face was all within ±30%.

As a comparison, Comparative Examples 1-1 to 3-4 are also shown. Comparative Examples 2-3 and 2-4 are targets in which the final heat treatment was not performed, and Comparative Examples 1-3, 1-4, 3-3 and 3-4 are cases where the heat treatment temperature was set to 750° C. for 1 hour.

TABLE 1

|  | Target | Resistivity (μΩ·cm) | Precipitates | Grain Size (μm) | Variation (±%) | Existence of Voids | Existence of Hillocks | Disconnections |
| --- | --- | --- | --- | --- | --- | --- | --- | --- |
| Examples 1-1 | Cu + 1.0% Sn | 3.3 | Not Observed | 23 | 15 | None | None | None |
| Comparative Examples 1-1 | Cu + 1.0% Sn | 2.7 | Small Amount | 68 | 26 | Existed | Existed | None |
| Examples 1-2 | Cu + 0.5% Sn | 2.5 | Not Observed | 22 | 11 | None | None | None |
| Comparative Examples 1-2 | Cu + 0.5% Sn | 2.1 | Small Amount | 48 | 12 | Existed | Existed | Existed |
| Examples 2-1 | Cu + 1.0% Al | 4.3 | Not Observed | 39 | 11 | None | None | None |
| Comparative Examples 2-1 | Cu + 1.0% Al | 3.8 | Small Amount | 85 | 34 | Existed | Existed | None |
| Examples 2-2 | Cu + 0.5% Al | 2.8 | Not Observed | 45 | 19 | None | None | None |
| Comparative Examples 2-2 | Cu + 0.5% Al | 2.2 | Small Amount | 95 | 42 | Existed | Existed | None |
| Examples 3-1 | Cu + 1.0% Ti | 15.1 | Not Observed | 29 | 13 | None | None | None |
| Comparative Examples 3-1 | Cu + 1.0% Ti | 12.6 | Small Amount | 58 | 18 | Existed | Existed | Existed |
| Examples 3-2 | Cu + 0.5% Ti | 13.2 | Not Observed | 36 | 9 | None | None | None |
| Comparative Examples 3-2 | Cu + 0.5% Ti | 10.5 | Small Amount | 41 | 26 | Existed | Existed | None |

TABLE 2

|  | Example 1-1 | Comparative Example 1-1 | Example 1-2 | Comparative Example 1-2 | Example 2-1 | Comparative Example 2-1 |
| --- | --- | --- | --- | --- | --- | --- |
| Sn | — | — | — | — | 0.01 | 0.01 |
| Al | 0.03 | 0.03 | 0.02 | 0.02 | — | — |
| Ti | 0.03 | 0.03 | 0.03 | 0.03 | 0.03 | 0.03 |
| Na | 0.01 | 0.01 | 0.01 | 0.01 | 0.01 | 0.01 |

TABLE 2-continued

|    |       |       |       |       |        |        |
|----|-------|-------|-------|-------|--------|--------|
| K  | 0.01  | 0.01  | 0.02  | 0.02  | 0.01   | 0.01   |
| Fe | 0.08  | 0.08  | 0.09  | 0.09  | 0.02   | 0.02   |
| Ni | 0.06  | 0.06  | 0.05  | 0.05  | 0.008  | 0.008  |
| Cr | 0.04  | 0.04  | 0.04  | 0.04  | 0.005  | 0.005  |
| Ca | 0.01  | 0.01  | 0.01  | 0.01  | 0.005  | 0.005  |
| C  | 10    | 10    | 8     | 8     | 10     | 10     |
| O  | 10    | 10    | 7     | 7     | 10     | 10     |
| H  | 1     | 1     | 1     | 1     | 1      | 1      |
| Ag | 0.27  | 0.27  | 0.23  | 0.23  | 0.3    | 0.3    |
| Zr | 0.005 | 0.005 | 0.005 | 0.005 | 0.01   | 0.01   |
| Hf | 0.001 | 0.001 | 0.001 | 0.001 | 0.001  | 0.001  |
| U  | 0.0001| 0.0001| 0.0001| 0.0001| 0.0001 | 0.0001 |
| Th | 0.0001| 0.0001| 0.0001| 0.0001| 0.0001 | 0.0001 |

|    | Example 2-2 | Comparative Example 2-2 | Example 3-1 | Comparative Example 3-1 | Example 3-2 | Comparative Example 3-2 |
|----|-------------|-------------------------|-------------|-------------------------|-------------|-------------------------|
| Sn | 0.02        | 0.02                    | 0.04        | 0.04                    | 0.04        | 0.04                    |
| Al | —           | —                       | 0.13        | 0.13                    | 0.11        | 0.11                    |
| Ti | 0.01        | 0.01                    | —           | —                       | —           | —                       |
| Na | 0.01        | 0.01                    | 0.01        | 0.01                    | 0.01        | 0.01                    |
| K  | 0.01        | 0.01                    | 0.01        | 0.01                    | 0.01        | 0.01                    |
| Fe | 0.03        | 0.03                    | 0.1         | 0.1                     | 0.1         | 0.1                     |
| Ni | 0.01        | 0.01                    | 0.03        | 0.03                    | 0.05        | 0.05                    |
| Cr | 0.004       | 0.004                   | 0.03        | 0.03                    | 0.01        | 0.01                    |
| Ca | 0.003       | 0.003                   | 0.05        | 0.05                    | 0.03        | 0.03                    |
| C  | 9           | 9                       | 10          | 10                      | 8           | 8                       |
| O  | 8           | 8                       | 10          | 10                      | 9           | 9                       |
| H  | 1           | 1                       | 1           | 1                       | 1           | 1                       |
| Ag | 0.23        | 0.23                    | 0.33        | 0.33                    | 0.22        | 0.22                    |
| Zr | 0.02        | 0.02                    | 0.01        | 0.01                    | 0.01        | 0.01                    |
| Hf | 0.001       | 0.001                   | 0.001       | 0.001                   | 0.001       | 0.001                   |
| U  | 0.0001      | 0.0001                  | 0.0001      | 0.0001                  | 0.0001      | 0.0001                  |
| Th | 0.0001      | 0.0001                  | 0.0001      | 0.0001                  | 0.0001      | 0.0001                  |

TABLE 3

Cu-1 wt % Sn (Corresponds to Example 1-1)

|           | 1     | 2     | 3     | 4     | 5     | 6     | 7     | 8     | 9     |
|-----------|-------|-------|-------|-------|-------|-------|-------|-------|-------|
| (111)     | 3602  | 3121  | 1782  | 2866  | 1971  | 2103  | 2866  | 2133  | 2966  |
| (200)     | 1915  | 1469  | 1347  | 1538  | 1422  | 1137  | 1255  | 1194  | 1499  |
| (220)     | 591   | 727   | 1024  | 587   | 982   | 793   | 913   | 608   | 816   |
| (311)     | 794   | 725   | 728   | 680   | 569   | 733   | 683   | 591   | 709   |
| (111)/(200)| 1.88 | 2.12  | 1.32  | 1.86  | 1.39  | 1.85  | 2.28  | 1.79  | 1.98  |

Cu-0.5 wt % Sn (Corresponds to Example 1-2)

|           | 1     | 2     | 3     | 4     | 5     | 6     | 7     | 8     | 9     |
|-----------|-------|-------|-------|-------|-------|-------|-------|-------|-------|
| (111)     | 3510  | 2960  | 1586  | 2768  | 2709  | 2814  | 2696  | 2812  | 2613  |
| (200)     | 1924  | 1528  | 1354  | 1643  | 1647  | 1598  | 1637  | 1635  | 1621  |
| (220)     | 623   | 745   | 1031  | 602   | 601   | 587   | 587   | 560   | 593   |
| (311)     | 814   | 702   | 701   | 667   | 690   | 683   | 677   | 680   | 653   |
| (111)/(200)| 1.82 | 1.94  | 1.17  | 1.68  | 1.64  | 1.76  | 1.65  | 1.72  | 1.61  |

TABLE 4

Cu-0.5 wt % Al (Corresponds to Example 2-1)

|           | 1     | 2     | 3     | 4     | 4     | 4     | 4     | 4     | 4     |
|-----------|-------|-------|-------|-------|-------|-------|-------|-------|-------|
| (111)     | 21421 | 16109 | 17788 | 24298 | 24298 | 24298 | 24298 | 24298 | 24298 |
| (200)     | 9024  | 8697  | 7570  | 8466  | 8466  | 8466  | 8466  | 8466  | 8466  |
| (220)     | 3107  | 5249  | 3713  | 2850  | 2850  | 2850  | 2850  | 2850  | 2850  |
| (311)     | 3970  | 3266  | 3690  | 3700  | 3700  | 3700  | 3700  | 3700  | 3700  |
| (111)/(200)| 2.37 | 1.85  | 2.35  | 2.87  | 2.87  | 2.87  | 2.87  | 2.87  | 2.87  |

Cu-1 wt % Al (Corresponds to Example 2-2)

|           | 1     | 2     | 3     | 4     | 5     | 6     | 7     | 8     | 9     |
|-----------|-------|-------|-------|-------|-------|-------|-------|-------|-------|
| (111)     | 29341 | 27830 | 26552 | 30444 | 22078 | 25913 | 25215 | 26319 | 31025 |
| (200)     | 12085 | 11620 | 11271 | 12027 | 13537 | 12550 | 13131 | 11388 | 12027 |

TABLE 4-continued

| (220) | 10458 | 11330 | 14816 | 9528 | 15687 | 14176 | 14525 | 14467 | 9703 |
|---|---|---|---|---|---|---|---|---|---|
| (311) | 6217 | 7321 | 5520 | 6101 | 6798 | 5403 | 5229 | 5926 | 5345 |
| (111)/(200) | 2.43 | 2.40 | 2.36 | 2.53 | 1.63 | 2.06 | 1.92 | 2.31 | 2.58 |

TABLE 5

| Cu-1 wt % Ti (Corresponds to Example 3-1) | | | | | | | | | |
|---|---|---|---|---|---|---|---|---|---|
| | 1 | 2 | 3 | 4 | 5 | 6 | 7 | 8 | 9 |
| (111) | 2466 | 3184 | 1548 | 2786 | 2963 | 3022 | 1638 | 2677 | 2997 |
| (200) | 1757 | 1652 | 1123 | 1780 | 1866 | 1542 | 1213 | 1643 | 1466 |
| (220) | 690 | 520 | 1129 | 513 | 613 | 513 | 544 | 498 | 533 |
| (311) | 666 | 709 | 586 | 684 | 658 | 684 | 711 | 644 | 703 |
| (111)/(200) | 1.40 | 1.93 | 1.38 | 1.57 | 1.59 | 1.96 | 1.35 | 1.63 | 2.04 |

| Cu-0.5 wt % Ti (Corresponds to Example 3-2) | | | | | | | | | |
|---|---|---|---|---|---|---|---|---|---|
| | 1 | 2 | 3 | 4 | 5 | 6 | 7 | 8 | 9 |
| (111) | 2176 | 3140 | 1505 | 2671 | 2666 | 2863 | 1335 | 2401 | 2939 |
| (200) | 1770 | 1689 | 1157 | 1847 | 1873 | 1552 | 1274 | 1672 | 1474 |
| (220) | 713 | 528 | 1125 | 512 | 632 | 514 | 546 | 460 | 534 |
| (311) | 635 | 720 | 585 | 694 | 672 | 685 | 680 | 641 | 703 |
| (111)/(200) | 1.23 | 1.86 | 1.30 | 1.45 | 1.42 | 1.85 | 1.05 | 1.44 | 1.99 |

TABLE 6

| Cu—Sn | Example 1-1 | Example 1-2 | Comparative Example 1-3 | Comparative Example 1-4 |
|---|---|---|---|---|
| (111)/(200) | 1.83 | 1.67 | 2.35 | 3.56 |
| Film Thickness standard deviation σ (%) | 1.5 | 1.1 | 1.7 | 1.9 |

| Cu—Al | Example 2-1 | Example 2-2 | Comparative Example 2-3 | Comparative Example 2-4 |
|---|---|---|---|---|
| (111)/(200) | 2.64 | 2.25 | 1.73 | 1.21 |
| Film Thickness standard deviation σ (%) | 1.3 | 1.4 | 1.8 | 2.6 |

| Cu—Ti | Example 3-1 | Example 3-2 | Comparative Example 3-3 | Comparative Example 3-4 |
|---|---|---|---|---|
| (111)/(200) | 1.65 | 1.51 | 2.74 | 3.46 |
| Film Thickness standard deviation σ (%) | 1.2 | 1 | 1.8 | 2.3 |

As clear from Table 1, regarding Examples 1-1 to 3-2, precipitates were not observed, the crystal grain size was within the range of 50 μm, the variation was minor, voids and hillocks did not exist, and there were no disconnections.

Contrarily, regarding Comparative Examples 1-1 to 3-2, precipitates were observed, the crystal grain size enlarged, the variation was significant, voids and hillocks existed, and there were disconnections. The results were all inferior in comparison to Examples 1-1 to 3-2.

Further, as shown in Tables 3 to 6, when the alloy contained Al, the ratio I(111)/I(200) of the X-ray diffraction peak intensity I(111) of the (111) face and the X-ray diffraction peak intensity I(200) of the (200) face was 2.2 or more in the sputtering face, and, when the alloy contained Sn and/or Ti, the ratio I(111)/I(200) of the X-ray diffraction peak intensity I(111) of the (111) face and the X-ray diffraction peak intensity I(200) of the (200) face was 2.2 or less in the sputtering face, the film thickness standard deviation σ was 1.5% or less, and a copper alloy sputtering target having superior evenness in film thickness was obtained thereby. Contrarily, in Comparative Examples 1-3, 1-4, 2-3, 2-4, 3-3 and 3-4, σ exceeded 1.5% in all cases, and resulted in inferior evenness.

Accordingly, it is evident that the copper alloy sputtering target of the present invention possesses favorable characteristics.

The copper alloy sputtering target of the present invention yields superior effects in that it is capable of preventing the generation of defects such as voids, hillocks and disconnections during copper electroplating, it has low resistivity, it has electromigration resistance and oxidization resistance characteristics, and it is able to form a stable and even seed layer.

What is claimed is:

1. A sputtering target for forming a seed layer of a semiconductor device, comprising: a copper alloy sputtering target containing 0.2 to 5 wt % of Al and having a sputtering face, said target having a resistivity of 2.2 μΩcm or more and an average crystal grain size of 50 μm or less, said target having a ratio I(111)/(200) of an X-ray diffraction peak intensity I(111) of a (111) face and an X-ray diffraction peak intensity I(200) of a (200) face of 2.2 or more in said sputtering face, and variation in I(111)/I(200) in said sputtering face is respectively within ±30%.

2. A copper alloy sputtering target according to claim 1, wherein said target contains 0.5 to 1 wt % of Al.

3. A sputtering target for forming a seed layer of a semiconductor device, comprising: a copper alloy sputtering target containing 0.2 to 5 wt % of an alloying component of Al and having a sputtering face, said target having a resistivity of greater than a resistivity of a copper alloy having the same composition in a thermal equilibrium state and an average crystal grain size of 50 μm or less, wherein a ratio I(111)/I(200) of an X-ray diffraction peak intensity I(111) of a (111) face and an X-ray diffraction peak intensity I(200) of a (200) face is 2.2 or more in said sputtering face, and variation in I(111)/I(200) in said sputtering face is respectively within ±30%.

4. A copper alloy sputtering target according to claim 3, wherein said target contains a total of 0.5 to 1 wt % of Al.

5. A copper alloy sputtering target according to claim 3, wherein an increase in resistivity due to said alloying component in said target is 1.2 times or more than that of said copper alloy in said thermal equilibrium state.

6. A copper alloy sputtering target according to claim 3, wherein variation in average grain size by location is within ±20%.

7. A copper alloy sputtering target according to claim 3, wherein variation in the content of said alloying component of Al by location in said target is within 0.2%.

8. A copper alloy sputtering target according to claim 3, wherein each of Na and K contained within said target is 0.1 ppm or less; each of Fe, Ni, Cr and Ca contained within said target is 1 ppm or less; each of U and Th contained within said target is 1 ppb or less, oxygen contained in said target is 5 ppm or less, hydrogen contained in said target is 2 ppm or less; and unavoidable impurities excluding alloying elements are 10 ppm or less.

9. A copper alloy sputtering target according to claim 1, wherein each of Na and K contained within said target is 0.5 ppm or less; each of Fe, Ni, Cr and Ca contained within said target is 2 ppm or less; each of U and Th contained within said target is 1 ppb or less, oxygen contained in said target is 5 ppm or less, hydrogen contained in said target is 2 ppm or less; and unavoidable impurities excluding alloying elements are 50 ppm or less.

10. A copper alloy sputtering target according to claim 1, wherein variation in average grain size by location is within ±20%.

11. A copper alloy sputtering target according to claim 1, prepared by a process comprising the steps of:
    obtaining a high purity copper alloy ingot by vacuum melting;
    performing at least one of hot forging and hot rolling to said high purity copper alloy ingot;
    thereafter, cold rolling said high purity copper alloy; and
    thereafter sandwiching said high purity copper alloy with copper plates underwater and performing forced cooling thereto.

12. A copper alloy sputtering target for forming a seed layer of a semiconductor device, comprising:
    a sputtering target body consisting of copper and 0.5 to 1 wt % of Al, said body having a sputtering face, an average crystal grain size of 50 μm or less, and a resistivity of 2.2 μΩcm or more;
    said target having a ratio I(111)/I(200) of an X-ray diffraction peak intensity I(111) of a (111) face and an X-ray diffraction peak intensity I(200) of a (200) face of 2.2 or more in said sputtering face, and a variation in I(111)/I(200) in said sputtering face of respectively within ±30%.

13. A copper alloy sputtering target according to claim 12, wherein said resistivity of said sputtering target body is 2.8 to 4.3 μΩ·cm.

14. A copper alloy sputtering target according to claim 12, wherein said ratio I(111)/I(200) in said sputtering face is of 2.2 to 2.25.

* * * * *

UNITED STATES PATENT AND TRADEMARK OFFICE
CERTIFICATE OF CORRECTION

PATENT NO. : 9,896,745 B2
APPLICATION NO. : 10/501117
DATED : February 20, 2018
INVENTOR(S) : Takeo Okabe et al.

Page 1 of 1

It is certified that error appears in the above-identified patent and that said Letters Patent is hereby corrected as shown below:

In the Claims

Column 12, Line 53 Claim 1, "a ratio I(111)/(200)" should read "a ratio I(111)/I(200)"

Signed and Sealed this
Twenty-fifth Day of September, 2018

Andrei Iancu
*Director of the United States Patent and Trademark Office*